US008062419B1

(12) United States Patent
Andreaco et al.

(10) Patent No.: US 8,062,419 B1
(45) Date of Patent: Nov. 22, 2011

(54) RARE-EARTH OXYORTHOSILICATE SCINTILLATOR CRYSTALS AND METHOD OF MAKING RARE-EARTH OXYORTHOSILICATE SCINTILLATOR CRYSTALS

(75) Inventors: Mark S. Andreaco, Knoxville, TN (US); Piotr Szupryczynski, Knoxville, TN (US); A. Andrew Carey, Lenoir City, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 12/967,442

(22) Filed: Dec. 14, 2010

(51) Int. Cl.
*C30B 29/22* (2006.01)
(52) U.S. Cl. ............... 117/13; 117/19; 117/71; 117/81; 117/82; 117/940
(58) Field of Classification Search .............. 117/13, 117/19, 71, 81, 82, 940
See application file for complete search history.

(56) References Cited

U.S. PATENT DOCUMENTS

| 5,025,151 A * | 6/1991 | Melcher ............... 250/269.6 |
| 6,921,901 B1 * | 7/2005 | Chai et al. ............. 250/361 R |
| 2008/0213151 A1 | 9/2008 | Yoshikawa et al. |
| 2008/0299027 A1 | 12/2008 | Kurata et al. |

OTHER PUBLICATIONS

Spurrier, Merry A., "Effects of Ca2+ Co-Doping on the Scintillation Properties of LSO:Ce", IEEE Transactions on Nuclear Science, vol. 55, No. 3, Jun. 2008, pp. 1178-1182.

* cited by examiner

*Primary Examiner* — Bob M Kunemund
(74) *Attorney, Agent, or Firm* — Peter L. Kendall

(57) ABSTRACT

A method of making LSO scintillators with high light yield and short decay times is disclosed. In one arrangement, the method includes codoping LSO with cerium and another dopant from the IIA or IIB group of the periodic table of elements. The doping levels are chosen to tune the decay time of scintillation pulse within a broader range (between about ~30 ns up to about ~50 ns) than reported in the literature, with improved light yield and uniformity. In another arrangement, relative concentrations of dopants are chosen to achieve the desired light yield and decay time while ensuring crystal growth stability.

13 Claims, 1 Drawing Sheet

RARE-EARTH OXYORTHOSILICATE SCINTILLATOR CRYSTALS AND METHOD OF MAKING RARE-EARTH OXYORTHOSILICATE SCINTILLATOR CRYSTALS

TECHNICAL FIELD

This disclosure relates to scintillator materials used for detecting ionizing radiation in nuclear imaging applications particularly PET (Position Emission Tomography), TOF PET (Time of Flight Positron Emission Tomography) and/or DOI PET (Depth of Interaction Positron Emission Tomography) imaging. This invention relates particularly to control of decay time, rise time and scintillation light yield of rare earth oxyorthosilicates. Specific arrangements also relate to control of decay time, rise time and scintillation light yield of rare earth oxyorthosilicates.

BACKGROUND

Lutetium oxyorthosilicate (LSO), or $Lu_2SiO_5$ activated with cerium ($Ce^{3+}$), is a well-known crystal scintillator material and widely used for medical imaging, such as gamma-ray detection in positron emission tomography (PET) as well as other applications. Due at least partly to its relatively high light yield and short decay time, LSO is considered to be one of the most suitable materials for molecular imaging applications specifically for time-of-flight PET (TOF PET).

LSO scintillators are typically made of single-crystal LSO grown from a melt using for example, the Czochralski process. For scintillator applications, it is often desirable to be able to grow large single-crystals of LSO with specific optical performance parameters. The size and quality of the grown crystals can be significantly affected by the growth stability.

While LSO scintillators in general have been well developed, efforts are on going to develop LSO scintillators with improved properties for specific applications.

SUMMARY OF THE DISCLOSURE

The present disclosure relates generally to LSO scintillators with high light yield and short decay times, and method of making such scintillators. In one arrangement, the method includes codoping LSO with cerium and another dopant from the IIA or IIB group of the periodic table of elements. The doping levels are chosen to tune the decay time of scintillation pulse within a broader range (between about ~30 ns up to about ~50 ns) than reported in the literature, with improved light yield and uniformity, while ensuring crystal growth stability.

A further aspect of the present disclosure relates to LSO scintillators with improved optical characteristics, including decay times tunable between about ~30 ns and about ~50 ns. In one configuration, the LSO scintillators include LSO doped with Ce and another dopant from the IIA or IIB group of the periodic table of elements, where the concentrations of Ce and the other dopant in the melt each range from about 0.001% to about 10% (atomic percentage used throughout the present disclosure unless otherwise specified; nomenclature used in the references to papers and patents remain consistent with the original text used by different authors).

DETAILED DESCRIPTION

I. Overview

Figure 1:
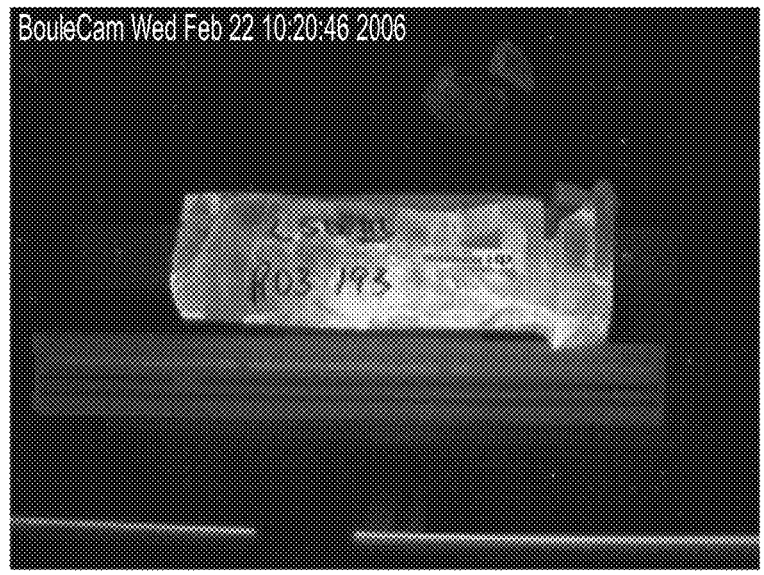
FIG. 1 shows an LSO crystal grown with high concentrations of Ce and Ca (Ce 0.1% and Ca 0.05%), where crystal growth instability problems occurred during the growth process.

This disclosure relates to scintillator materials used for detecting ionizing radiation in nuclear imaging applications particularly PET (Position Emission Tomography), TOF PET (Time of Flight Positron Emission Tomography) and/or DOI PET (Depth of Interaction Positron Emission Tomography) imaging, where PET imaging is inclusive of dedicated PET, and hybrid PET imaging modalities such as: PET/CT (Positron Emission Tomography with Computed Tomography capabilities), PET/MR (Positron Emission Tomography with Magnetic Resonance capabilities) and PET/SPECT (Positron Emission Tomography with Single Photon Emission Computed Tomography capabilities). This disclosure relates particularly to control of decay time, rise time and scintillation light yield of rare earth oxyorthosilicates.

Lutetium oxyorthosilicate (LSO) or $Lu_2SiO_5$, invented by Charles L. Melcher and described in U.S. Pat. No. 4,958,080, is a well-known crystal scintillator material that is widely used for gamma-ray detection in PET as well as other applications.

LSO traditionally used in nuclear imaging scintillator devices has the general chemical formula $Ce_{2x}Lu_{2(1-x)}SiO_5$ and is typically doped with Ce in the range $0.001 \leq x \leq 0.1$ (i.e. 0.1% to 10%) in the melt, while other impurities are limited to low levels. Cerium ions play a role as extrinsic luminescence centers, or activators, in the material, producing ultraviolet or blue light under excitation with high energy ionizing radiation (for example, gamma, x-ray, beta, alpha radiations). LSO has a density 7.4 $g/cm^3$, relatively high light yield (up to about 75% of NaI:Tl), and fast decay time (41 ns). LSO is widely used in the field of medical imaging. The original composition of LSO crystal contains cerium as the only intentional dopant. Crystals are grown using the Czochralski technique with a well defined growth atmosphere consisting primarily of an inert gas with a few percent of oxygen. LSO is currently considered to be the most suitable material for molecular imaging applications specifically for TOF PET.

TOF PET has been of interest for medical imaging for some time. Ishii et al. (Ishii K, Watanuki S, Orihara H, Itoh M, Matsuzawa T. Improvement of time resolution in a TOF PET system with the use of $BaF_2$ crystals. Nucl. Instr. Meth. In Phys. Research 1986; A-253:128-134) reported one of the first TOF PET systems built based on $BaF_2$ scintillator material. $BaF_2$ of a density 4.89 g/cc, effective Z of 52.2 and decay time of 600 ps was the best scintillator available for TOF PET application at that time. However, $BaF_2$ has multiple limitations for TOF PET: It has light output of only 5% of NaI:Tl, secondary slow component 620 ns of decay time and poor stopping power for 511 keV. In contrast, cerium activated rare earth oxyorthosilicates with inherent physical properties of higher density and effective Z along with much higher light yield and short decay times are more suitable for TOF PET. Researchers skilled in the art of PET have known that the convolution of several parameters such as: decay time, rise time and light output are critical for TOF PET scintillators. Shao et al. (Shao Y., "A new timing model for calculating the intrinsic timing resolution of a scintillator detector", Phys. Mec. Biol. 52 (2007) 1103-1117) provides a comparison of these parameters of several scintillators of interest for TOF PET. GSO:Ce, a rare earth oxyorthosilicate with multi-decay time components has been used in medical imaging.

Sumiya K. et al., GSO single crystal and scintillator for PET, (U.S. Patent Application Publication No. US2003/0159643 A1) investigated and demonstrated the effect of cerium concentration on the scintillation properties. GSO codoped with Ce shows two components in the scintillation time profile of cerium emission. The fast component decays within the range of 30-60 ns and the slow component between 400-600 ns. Sumiya was able to reduce the relative contribution of slow and fast components in scintillation time profile (reducing output ratio) and vary the fast component of the decay time from 60 ns to 35 ns by increasing concentration of Ce from 0.5% to 1.5%, respectively. However, the change in the Ce concentration reduces light output and degrades energy resolution. Sumiya shows that this effect can be associated with the presence of the $Ce^{4+}$ ions causing yellow coloration. Sumiya also attempted to further modify the scintillation properties of GSO by eliminating the coloration by codoping with one of the elements from Mg, Ta and Zr. GSO:Ce single crystal codoped with one of these impurities are colorless and the transmission of its emission wavelength is not reduced even if Ce concentration is about 1.5%. His teaching further demonstrates that output ratio of slow component is reduced to above ½ time and the decay time is faster than that for GSO:Ce by a factor of ⅓.

Inherent characteristics of LSO (density of 7.4 g/cc, effective Z of 65.5, single component decay time of about 41 ns, and light output of 75% of NaI:Tl) makes it a highly suitable PET scintillator. However, applying the teachings of Sumiya with respect to varying Ce concentration in LSO for the purpose of changing decay time does not substantially produce the desired result. This demonstrates that the teaching of Sumiya cannot be successfully applied to all rare earth oxyorthosilicates. Sumiya's teachings are limited to GSO:Ce. Zavartsev at al. (Zavartsev Y. D., Koutovoi S. A., Zagumennyi A., "Czochralski, growth and characterization of large $Ce^{3+}$: $Lu_2SiO_5$ single crystals codoped with $Mg^{2+}$ or $Ca^{2+}$ or $Tb^{3+}$ for scintillators", Journal of Crystal Growth 275 (2005) e2167-e2171) showed that highly doped LSO:Ce (0.15-0.22 at %) provides 75% of light output of NaI:Tl and decay time of about 41 ns. Low-doped crystals have lower light output and decay time of 44-45 ns. However, for highly doped LSO:Ce crystals two main types of imperfections are observed: constitutional supercooling fine scattering and yellow color, attributed to the lattice defects near $Ce^{4+}$ ions. This observation is consistent with the teaching of Sumiya. Zavartsev also teaches that codoping with trivalent ion $Tb^{3+}$ results in a non-radiative energy transfer from $Ce^{3+}$ to $Tb^{3+}$ ions that reduces decay time to 34 ns but also reduces light output by about 50%; and that the crystals are colorless for Ce concentration of 0.2% and Tb 1%. Higher concentrations of Ce and Tb result in a light green color. Zavartsev further teaches that addition of divalent ions $Ca^{2+}$ or $Mg^{2+}$ into the melt containing tetravalent $Ce^{4+}$ or $Si^{4+}$ or $Zr^{4+}$ ions suppress the tendency of spiral growth and cracking of the crystals that was based on gallium garnets growth technology. Zavartsev further teaches that the concentration of oxygen vacancies is important for the scintillation mechanism because it involves the recombination process of many electron-hole pairs during gamma-excitation, as photoluminescence efficiency of $Ce^{3+}$ emission in oxides crystals including LSO:Ce. The quantity of oxygen vacancies is controlled with the acceptor dopant, for example $Ca^{2+}$ and $Mg^{2+}$ ions. Calcium or magnesium dopants fix the concentration of oxygen vacancies in crystals for example YAG:Ca,Ce. Zavartsev observed that during cutting, LSO: Ce:Mg crystals have a tendency to crack in contrast to, LSO: Ce:Ca crystals. Zavartsev shows (at Table 1 of the Zavartsev reference) that LSO:Ce:Mg and LSO:Ce:Ca are both colorless and have essentially the same light output as LSO:Ce. For Ce concentration of 0.25% and Mg 0.02% LSO:Ce:Mg exhibits 39 ns decay time. For Ce concentration of 0.22% and Ca 0.02% LSO:Ce:Ca exhibits 41 ns decay time. LSO:Ce:Ca exhibits fairly strong afterglow attributed to thermal activated de-trapping of charge carriers from deep traps followed by electron-hole recombination at $Ce^{3+}$. This finding is in contrast to certain data presented by Ferrand et al. (Ferrand et. al, Dense high-speed scintillator material of low afterglow, U.S. Patent Application Publication No. US2010/0065778 A1), where it is disclosed that introduction of a divalent alkaline earth metal ions M substituting for a trivalent rare earth ion, or trivalent metal ions M' substitutes for a tetravalent silicon atom, creates a positive charge deficit that limits the trapping of electrons responsible for the afterglow. Ferrand discloses that the addition of a divalent alkaline earth metal M and/or trivalent metal M' to LYSO type composition substantially reduce afterglow. In particular, M may be Ca, Mg, or Sr (in divalent cation form). In particular, M' may be Al, Ga, or In (in trivalent cation form), with element M substituting for Y or Lu, and element M' substituting for Si. The introduction of a divalent alkaline earth metal ions M and/or trivalent metal ions M' was for the specific purpose of reducing the afterglow. (See also, PCT Patent Publication WO 2006/018586 A1.)

Chai et al (Chai B. H. T. Ji Y. Lutetium yttrium orthosilicate single crystal scintillator detector, U.S. Pat. No. 6,624,420 B1) teaches that Ce doped LSO has several serious problems. They include: (1) trace amount of naturally occurring long-lived radioactive isotope $^{176}Lu$, (2) LSO crystals have very deep traps defects evidenced by very long phosphorescence after exposure to a UV light source, (3) crystal growth requires very high melting temperatures 2200° C., which is detrimental to insulation and iridium crucibles used for growing the crystals, and (4) high cost of lutetium oxide raw material. Chai states that the material purity 99.99 is not sufficient to guaranty the consistent light yield. It is, in his teaching, highly desirable to replace $Lu_2O_3$ as the main ingredient in new scintillator crystals, namely LYSO. The LYSO inventors addressed these problems by (1) substituting Lu with Y to reduce $^{176}Lu$ content in the scintillator, and (2) lowering the crystal growth temperature by 100° C. For the trap problem, Chai et al. concluded that the crystallization process that has been found to be a purification process implies that the top portion of the crystal boule have the least impurity content and would have the best light yield performance. Rapid reduction of light yield occurs when crystal growth is progressing and a greater fraction of the melt is converted to the crystal. They go on to state that this is consistent with all published speculations that impurities are the primary cause of creating deep traps that give long phosphorescence and reduces scintillation light yield. They concluded that the impurities are coming from $Lu_2O_3$ starting material. To reduce phosphorescence it is necessary to reduce the lutetium content by yttrium substitution. To address detriment to insulation and Iridium crucibles they reduce temperature by 100° C. by substituting substantial amount of Lu with Y. To adjust the problem with high cost of lutetium oxide they substituted lutetium with yttrium down to as low as 70% substitution (degradation of the light yield occurs for more than 70% of substitution).

All of the disclosures and publications cited above are directed to solving problems associated with phosphorescence (afterglow), or transmittance where the inventors either use codoping with divalent or trivalent ions or substituting of lutetium by yttrium in the case of LSO. In the case of GSO the inventors additionally made the attempt to change scintillator decay time by changing the Ce content. However, this change compromised the transmittance and light yield of the scintillator. To address the transmittance problem, GSO was codoped with metal ions.

Zagumennyi et al. (Zaguemnnyi A. I., Zavartsev Y. D., Studenekin P. A., Scintillating substance and scintillating wave-guide element, U.S. Pat. No. 6,278,832 B1) made an attempt to change multiple properties of Lu-based scintillator materials: increase in the light output of luminescence, decrease of the time of luminescence of $Ce^{3+}$, increase of the reproducibility of properties of grown single crystals, decrease of the cost of the source melting stock for growing crystals scintillators due to the large amounts of $Lu_2O_3$ needed, and prevent cracking during manufacturing scintillation elements. Some of his teaching is explained based on the example of LSO:Ce scintillator. Zagumennyi teaches that different displacement of oxygen ions after the substitution of $Ce^{3+} \to Lu_1$, $Lu_2$ in coordination polyhedron $LuO_7$ and $LuO_6$ determine practically different scintillation characteristics of the material. The light output, the position of the luminescence maximum and the constant of the time of scintillations decay (time of luminescence) depend on the number of $Ce^{3+}$, which substituted ions $Lu_1$ and/or $Lu_2$. Thus in gamma excitation, both centers of luminescence are excited and luminescence simultaneously, and the time constant for scintillation decay will depend on the duration of luminescence of both the first and second centers and on the relationship of the concentration of ions of $Ce^{3+}$ in coordination polyhedrons $LuO_7$ and $LuO_6$. The center of luminescence $Ce_1$ (polyhedron $LuO_7$) has a time of luminescence of 30-38 ns and the position of the luminescence maximum 410-418 nm; the center of luminescence $Ce_2$ (polyhedron $LuO_6$) has a time of luminescence of 50-60 ns and the position of maximum luminescence of 450-520 nm. Zagumennyi teaches that the best technical result is observed in scintillating crystals containing ions $Ce^{3+}$ only in polyhedrons $LuO_7$. The simultaneous presence of $Ce^{3+}$ ions in $LuO_7$ and $LuO_6$ decreases the light output by 3-10 times, increasing the time of luminescence up to 40-50 ns and shifts the luminescence maximum into the area of less sensitivity of photo multiplier tubes. Moreover, he teaches that the crystals containing ions of $Ce^{3+}$ advantageously in coordination polyhedrons $LuO_7$ are produced from melts additionally doped with ions of the following elements: Zr, Sn, Hf, As, V, Nb, Sb, Ta, Mo, W. By that, ions of Ti, Zr, Sn, Hf, Nb, Sb, Ta occupy in the crystal lattice the position with octahedral coordination (polyhedron $LuO_6$) due to higher bond energies of these ions. Ions of As, V, Mo, W, occupy tetrahedral positions, however, with that, the octahedral positions are strongly distorted. According to Zagumennyi, the decrease in the light output is also a result of use as a source reagent of $Lu_2O_3$ with the purity of 99.9% (or less) instead of reagent $Lu_2O_3$ with a purity of 99.99% (or higher). Some admixture with the source reagent $Lu_2O_3$ with the 99.9%-or-less-pure $Lu_2O_3$ can decrease the light output luminescence 2-10 times. The decrease in the light output occurs due to the formation of $Ce^{4+}$ ions in heterovalent substitution which takes place during the growth of crystal on the background of crystallization. Zagumennyi further identified the simplest schemes of substitutions that have either optimum or harmful effect on the crystal performance:

1) $Lu^{3+}+Si^{4+} \to Ce^{3+}+S^{4+}$—optimal substitution of lutetium ions by cerium ions, 2) $Lu^{3+}+Si^{4+} \to Ce^{4+}+Me^{3+}$—highly probable, harmful and undesirable heterovalent substitution with the compensation of charge for admixture of $Me^{3+} \leq$Be, B, Al, Cr, Mn, Fe, Co, Ga, In.

3) $2Lu^{3+} \to Ce^{4+}+Me^{2+}$—highly probable, harmful and undesirable heterovalent substitution with the compensation of charge for admixture $Me^{2+}$=Mg, Ca, Mn, Co, Fe, Zn, Sr, Cd, Ba, Hg, Pb.

4) $3Lu^{3+} \to Ce^{4+}+Ce^{4+}+Me^{1+}$—probable, harmful and undesirable heterovalent substitution with the compensation of charge at big concentration of cerium ions for admixture of $Me^+$=Li, Na, K, Cu, Rb, Cs, Tl.

Zagumiennyi also teaches that the additional introduction into the melt of at least one of the chemical compounds (for example, oxide) of the elements of the group Zr, Sn, Hf, As, V, Nb, Sb, Ta, Mo, W, in the amount 2-3 times greater than the total concentration of admixture ions $(Me^+ + Me^{2+} + Me^{3+})$ eliminates the formation of $Ce^{4+}$ ions in the process of the crystal growth.

Zagumiennyi is focused on primary improvement in light output of the materials with crystallographic structure of LSO by elimination of $Ce^{4+}$ ions and on control of $Ce^{3+}$ concentration in $LuO_7$ polyhedrons. He also teaches that by increasing the concentration of $Ce^{3+}$ ions in $LuO_7$ polyhedrons it is possible to decrease decay time of scintillation pulse down to 30 ns for LSO material. In accordance to Zagumiennyi's teaching this effect can be achieved by codoping of LSO material with Zr, Sn, Hf, As, V, Nb, Sb, Ta, Mo and W.

On the other hand Spurrier at al. (Spurrier M, Melcher C. L., Szupryczynski P., Carey A. A. "Lutetium oxyorthosilicate scintillator having improved scintillation and optical properties and method of making the same," U.S. patent application Ser. No. 11/842,813 discloses the role of $Ca^{2+}$ and other divalent metal ions such as Ba, Mg, Sr, and their positive effect on light output and decay time of LSO. Contrary to Zagumiennyi's teaching which regards divalent metal ions "harmful and undesirable heterovalent substitutions" for $Lu^{3+}$, Spurrier at al. (Spurrier M. A., Szupryczynski P., Yang K. Carey A. A., Melcher C. L., Effects of $Ca^{2+}$ codoping on the scintillation properties of LSO:Ce, IEEE Trans. Nucl. Sci., vol 55 no. 3 (2008) 1178-1182) provides supporting experimental data showing the significant increase in light output of LSO:Ce,Ca (38,800 photons/MeV) compared to LSO:Ce (30,900 photons/MeV). Moreover, the increase in concentration of $Ca^{2+}$ codopant in LSO:Ce,Ca results in shortened decay time (as short as 31 ns for Ca concentration 0.3-0.4%). The Spurrier references show that increase in $Ca^{2+}$ concentration changes the relative concentrations of $Ce^{3+}$ ions between two cerium sites, referred to by Zagumennyi as "$LuO_7$ and $LuO_6$ polyhedrons." The Spurrier references teach that the presence of $Ca^{2+}$ in the structure of LSO also compensates for oxygen vacancies that would otherwise diminish light output by trapping electrons in competition to $Ce^{3+}$. This possibility is supported by the importance of an oxygen-containing growth atmosphere. A further possibility, in accordance to the Spurrier references, is that a presence of $Ca^{2+}$ suppresses an as yet unidentified trapping center. However, unless $Ca^{2+}$ interacts preferentially with only one of the two cerium sites, such interactions would seem to primarily pertain to increase light output rather than faster decay time. The Spurrier references disclose that the decay time of LSO:Ce, Ca can be tuned between 31 ns up to 43 ns. However, higher concentrations of $Ca^{2+}$ necessary to achieve short decay times result in significant problems with crystal growth stability causing severe crystal deformation and cracking. These problems are related to the changes in surface tension properties of the melt that results in difficulties in maintaining stable crystal-melt interface in the Czochralski growth process of LSO. Spurrier et al. (Spurrier M. A., Szupryczynski R, Rothfuss H., Yang K., Carey A. A., Melcher C. L., "The effect of codoping on the growth stability and scintillation properties of LSO: Ce", Journal of Crystal Growth 310, (2008) 2110-2114) proposes a method for controlling of crystal-melt interface by codoping with Zn. While relatively high concentrations of Zn improve growth stability, the low boiling point of Zn results in evaporation of Zn from the melt and difficulties in controlling its concentration in the melt. The problem is even more severe during growth of large diameter commercial size LSO boules, where relatively large exposed area of the melt causes an increase in evaporation of Zn.

To reduce or eliminate the shortcomings of the prior art, the present disclosure discloses a composition of oxyorthosilicate materials doped with cerium, and with additional codopants of various elements selected from groups IIA and IIB periodic table of elements (Mg, Ca, Sr, Ba, Zn, Cd). The examples disclosed herein allow one to achieve a tunable decay time of scintillation pulse within a broader range (between about 30 ns and about 49 ns) than reported to date (see, the Spurrier 2008 paper). Additionally, they allow a better control over the crystal production process by reducing or eliminating growth instability problems and minimizing production losses due to crystal cracking that was reported for high concentration of codopants (see, the Spurrier 2008 paper). Moreover, they provide methods of improving light output and uniformity of codoped crystals with optimized high light output and scintillation time profile that can be tuned to very specific scintillator applications. As a result of better control of the oxyorthosilicate material production process the overall crystal production cost can be lowered that opens new avenue for further development of scintillator crystal based radiation detection technologies.

The general chemical formula for an example LSO material is

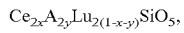

$$Ce_{2x}A_{2y}Lu_{2(1-x-y)}SiO_5,$$

where A denotes one or more divalent element from the group: Mg, Ca, Sr, Ba, Zn, Cd or any combination thereof. Here, A is a codopant that is used in conjunction with an activator ion (preferably, as in this example, Ce) in specific concentration ratios to tune the scintillator decay time and to achieve optimum other scintillation properties. In this example x is greater or equal to 0.00001 and less or equal to 0.1 (i.e., from about 0.001% to about 10%), and y is greater or equal to 0.00001 and less or equal to 0.1 (i.e., from about 0.001% to about 10%).

Preliminary experiments on full size production boules (80 mm or larger in diameter) show that codoping with Mg, Sr and Zn in low concentrations (i.e., concentration of codopant at least 10 times lower than concentration of Ce) results in an increase in the decay time of LSO (approaching ~50 ns), as shown in Example 7, 8 and 9 below. Moreover, higher concentrations of Mg and Sr (i.e, concentration of codopants at least 3 times higher than concentration of Ce) can result in a decay time of as short as reported by Spurrier (Spurrier M, Melcher C. L., Szupryczynski P., Carey A. A. Lutetium oxyorthosilicate scintillator having improved scintillation and optical properties and method of making the same" U.S. patent application Ser. No. 11/842,813) with Ca codopant, as shown in Examples 4 and 5 below. In contrast, lower concentrations of Ca (relative to Ce) does not result in longer scintillation decay time (longer than 41 ns, see example 6 below) as mentioned above with the other elements from groups IIA and IIB. The present disclosure includes examples of codoping schemes that includes specific combinations of selected codopants introduced to the melt in their predetermined relative concentrations. These concentrations are defined relative to the concentration of $Ce^{3+}$ and other codopants. Additionally, the concentration of the $Ce^{3+}$ is adjusted relatively to the overall concentration of codopants in the melt from which crystal is pulled to minimize the surface tension effects. Controlling the codopant ratios can optimize the performance of the resultant material, namely: optimum light output, fast rise time with short decay time (approaching ~30 ns), or optimum light output, fast rise time with long decay time (approaching ~50 ns). Appropriate adjustments of the concentration of $Ce^{3+}$ relative to the concentrations of IIA and/or IIB elements enable maintaining the stability of the crystal growth process (see, Examples 1 and 2 below). The following schemes are examples of concentrations cerium and other codopants from group IIA and IIB for achieving improved scintillation characteristics of LSO:

Scheme 1. LSO with slow decay time (approaching ~50 ns): cerium concentration 0.1% or higher, with elements Mg, Sr, Zn or Cd present less than 1/10 of the Ce concentration.

Scheme 2. LSO with fast decay time (approaching ~30 ns): cerium concentration 0.05% or less, and Ca, Mg, Sr, Zn, or Cd more than 3 times of the Ce concentration.

Scheme 3. LSO with exceptional uniformity and exceptional light output: Cerium concentration 0.2% or higher, and additional Mg and Ca, or Mg and Sr or Ca and Sr in concentrations less than 1/4 for of the Ce concentration.

Moreover, the specific concentration codoping schemes above are beneficial for controlling the scintillation time profile that is favorable for TOF PET applications. In accordance to the Shao reference above, fast rise times, along with short decay times and high light output are critical parameters for achieving the best timing characteristics of the TOF PET detectors. The best time resolution was experimentally achieved with detectors built from LSO crystals grown following scheme 2, in good agreement with Shao. These crystals have faster rise time, shorter decay time and relatively high light output compared to the other LSO compositions synthesized based on scheme 1 and 3.

Additional benefits of having the ability to produce scintillators with tuned decay time is the ability of utilizing a DOI information (Depth of Interaction) and pulse shape discrimination techniques in a "phoswich" configurations of a PET detector block. In a phoswich configuration, a crystal element includes two or more crystals with different scintillation decay times. Maximum spread in the decay time of ~20 ns allows one to clearly distinguish between different sections of the crystal element and minimize a parallax effect in the image reconstruction algorithms.

Experimental work done on other oxyorthosilicates produces similar benefits to these described above. Example 11 shows the data obtained for LYSO (LSO with intentionally added Yttrium) crystal grown with Ca concentration higher than Ce produced a short decay time. Further increase in Ca content in accordance to scheme 2 resulted in decrease in decay time similar to this observed in LSO without Yttrium.

Example 12 shows LYSO composition codoped with low concentrations of Ca and Mg relatively to Ce. This composition results in an increase in the decay time very similar to observed in LSO material.

The families of oxyorthosilicate scintillators proposed in this work can be successfully applied in any gamma/x-ray detector system regardless of the type of the optical sensor chosen. Examples include detectors for the field of Medical Diagnosis (PET, PET/CT, SPECT, SPECT/CT, MR/PET sys-

II. EXAMPLE CONFIGURATIONS

Examples 1-12

LSO scintillator crystals were grown using the well-known Czochralski process (cited above). Starting materials $Lu_2O_3$, $SiO_2$, $CeO_2$, ZnO, CaO, MgO, $SrCO_3$, $Y_2O_3$ were at least 99.99% pure. Nominal concentrations of codopants in the melt were adjusted according to codoping schemes 1-3 discussed above. The actual concentration of codopants in the crystal may differ from the concentration in the melt due to the solid-liquid segregation and the fraction of the melt solidified. The crystals were grown with pull rate ~3 mm per hour, with a rotation rate 1 rpm. The growth atmosphere composition during crystal growth and cooldown was maintained constant with approximately one percent of oxygen in bulk nitrogen. The crystals were grown to about 80 mm in diameter and about 240 mm in length. The slabs had 20 mm in thickness and were cut and numbered, starting from the bottom section of the crystal boule. Light output measurements were done under excitation with $Cs^{137}$ gamma source (662 keV). The scintillation light was collected using Hamamatsu R877 photomultiplier. The results are presented using arbitrary scale defined by numbers of channels of MCA (Multichannel Analyzer) unit used in the measurements. BGO crystal was used as a reference (BGO photopeak was measured at 100 channel position). Decay time was measured using zero crossing method.

Example 1

FIG. 1 shows a LSO crystal boule with high concentrations of 0.1% Ce and 0.05% Ca. Crystal growth instability problems occurred during growth process. This crystal was grown using the art of Spurrier (U.S. patent application Ser. No. 11/842,813) applied to a commercial size LSO boule.

Example 2

Figure 2:
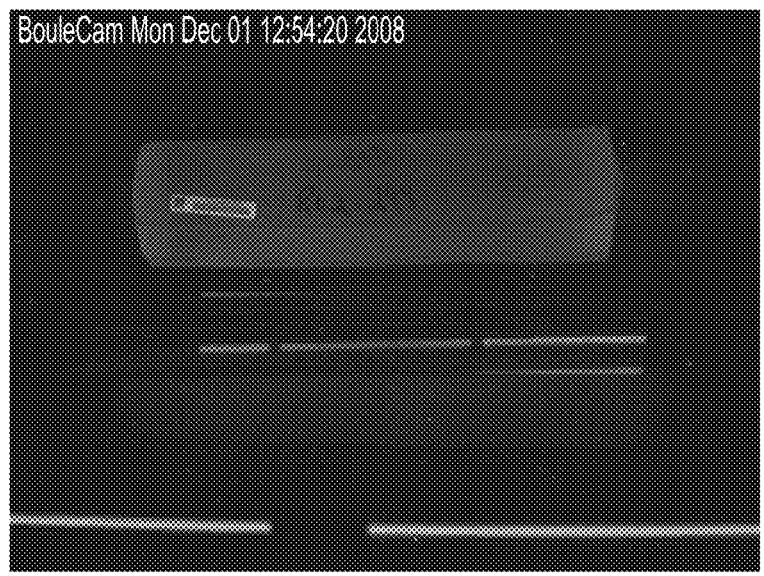
FIG. 2 shows an LSO crystal grown with appropriate adjustment of Ce and Ca concentrations (Ce 0.025% and Ca 0.1%). The conditions of the crystal growth was the same as those used for growing the crystal shown in FIG. 1, except for the Ce and Ca concentrations The crystal growth was stable.

FIG. 2 shows a LSO crystal boule with Ce and Ca with appropriate adjustments of cerium and calcium concentrations according to scheme 2. The commercial size crystal boule was grown under stable growth conditions, with 0.025% Ce and 0.1% Ca, respectively.

In example 1 cerium concentration is relatively high, calcium content is a factor of 2 lower than cerium. However, a combined effect of Ce and Ca introduces instabilities in crystal-melt interface causing severe crystal cracking and loss of control over the crystal growth process. In the example 2, Ce concentration is 4 times lower, and calcium concentration is 2 times higher than in the example 1. However, combined effect of Ce and Ca does not affect crystal growth stability. Higher concentration of Ca over Ce is necessary to achieve scintillation time profile that is favorable for application in TOF PET.

Example 3

Table 1 shows the light output and decay time measured for LSO crystal with an adjusted Ca to Ce concentrations ratio (Ce 0.033%, Ca 0.1%) according to scheme 2.

TABLE 1

| Slab number | Light Output* [chMCA] | Decay Time [ns] |
|---|---|---|
| 1 | 527 | 32.6 |
| 2 | 501 | 32.6 |
| 3 | 492 | 32.7 |
| 4 | 500 | 32.6 |
| 5 | 505 | 33.8 |
| 6 | 503 | 32.6 |
| 7 | 512 | 34 |
| 8 | 505 | 32.5 |
| 9 | 548 | 33.9 |
| 10 | 515 | 32.6 |
| 11 | 517 | 34 |
| 12 | 527 | 32.6 |
| 13 | 519 | 32.5 |

*Light output was measured relative to BGO crystal reference light output, with a photopeak position at 100 channel MCA.

Example 4

Table 2 shows the light output and decay time measured for LSO crystal with adjusted Mg to Ce concentrations ratio (Ce 0.025%, Mg 0.1%) according to scheme 2.

TABLE 2

| Slab number | Light Output* [chMCA] | Decay Time [ns] |
|---|---|---|
| 1 | 601 | 34.8 |
| 2 | 633 | 34.6 |
| 3 | 625 | 35.4 |
| 4 | 635 | 35 |
| 5 | 605 | 36 |
| 6 | 668 | 35.7 |
| 7 | 609 | 35.9 |
| 8 | 646 | 35.8 |
| 9 | 620 | 35.8 |
| 10 | 632 | 36 |

Example 5

Table 3 shows the light output and decay time measured for LSO with high concentration of strontium (Ce 0.025%, Sr 0.1%) according to scheme 2.

TABLE 3

| Slab number | Light Output* [chMCA] | Decay Time [ns] |
|---|---|---|
| 1 | 653 | 37 |
| 2 | 583 | 34.3 |
| 3 | 653 | 36.6 |
| 4 | 586 | 34.6 |
| 5 | 627 | 36.4 |
| 6 | 576 | 34.8 |
| 7 | 604 | 36.4 |
| 8 | 576 | 36.2 |
| 9 | 625 | 36.1 |
| 10 | 605 | 36.4 |
| 11 | 581 | 34.6 |
| 12 | 581 | 36.4 |

Example 6

Table 4 shows the light output and decay time measured for an LSO with the lower concentration of Ca (Ce 0.1%, Ca 0.05%).

TABLE 4

| Slab number | Light Output* [chMCA] | Decay Time [ns] |
|---|---|---|
| 1 | 451 | 36.75 |
| 2 | 454 | 37.59 |
| 3 | 491 | 37.4 |
| 4 | 511 | 37.56 |
| 5 | 536 | 38.01 |
| 6 | 560 | 38.28 |
| 7 | 554 | 37.84 |
| 8 | 559 | 38.65 |
| 9 | 567 | 38.83 |
| 10 | 570 | 39.08 |
| 11 | 574 | 39.4 |
| 12 | 596 | 38.98 |

Example 7

Table 5 shows the light output and decay time measured for an
LSO with a low concentration of Mg (Ce 0.35%, Mg 0.01%) according to scheme 1.

TABLE 5

| Slab number | Light Output* [chMCA] | Decay Time [ns] |
|---|---|---|
| 1 | 628 | 48.1 |
| 2 | 633 | 47.9 |
| 3 | 603 | 47.7 |
| 4 | 644 | 47.7 |
| 5 | 609 | 47.4 |
| 6 | 650 | 48 |
| 7 | 615 | 47.8 |
| 8 | 612 | 47 |
| 9 | 593 | 46.1 |
| 10 | 644 | 47.1 |
| 11 | 630 | 45.9 |
| 12 | 634 | 47.6 |

Example 8

Table 6 shows the light output and decay time measured for an LSO with a low concentration of Sr (Ce 0.2%, Sr 0.02%) according to scheme 1.

TABLE 6

| Slab number | Light Output* [chMCA] | Decay Time [ns] |
|---|---|---|
| 1 | 507 | 47.7 |
| 2 | 511 | 47.6 |
| 3 | 518 | 47.7 |
| 4 | 556 | 48.6 |
| 5 | 568 | 48.3 |
| 6 | 558 | 47.8 |
| 7 | 552 | 47.8 |
| 8 | 559 | 47.9 |
| 9 | 566 | 47.9 |
| 10 | 563 | 47.6 |
| 11 | 572 | 47.1 |
| 12 | 517 | 47.7 |

Example 9

Table 7 shows the light output and decay time measured for an LSO codoped with Ce 0.2% and low concentrations of Zn 0.05%. The concentration of Zn is calculated at temperatures below vaporization point of Zn compound used in the experiment). Since the vaporization rate of Zn at temperatures exceeding 2000° C. (approaching melting point of LSO) is very high, the effective concentration of Zn in the melt during crystal growth process drops significantly. The composition of the melt during crystal growth process that reflects the concentration ranges described by scheme 1.

TABLE 7

| Slab number | Light Output* [chMCA] | Decay Time [ns] |
|---|---|---|
| 1 | 663 | 45.9 |
| 2 | 593 | 46.7 |
| 3 | 606 | 47.1 |
| 4 | 617 | 46.8 |
| 5 | 599 | 46.8 |
| 6 | 597 | 46.9 |
| 7 | 568 | 46.5 |
| 8 | 599 | 46.7 |
| 9 | 596 | 46.6 |
| 10 | 587 | 46.5 |
| 11 | 590 | 46.6 |

Example 10

Table 8 shows the light output and decay time measured for an LSO with a low concentration of Mg and low concentration of Ca (Ce 0.2%, Mg 0.015%, Ca 0.01%) according to scheme 3.

TABLE 8

| Slab number | Light Output* [chMCA] | Decay Time [ns] |
|---|---|---|
| 1 | 605 | 47.8 |
| 2 | 584 | 47.5 |
| 3 | 562 | 48.1 |
| 4 | 569 | 47.9 |
| 5 | 575 | 47.7 |
| 6 | 590 | 47.1 |
| 7 | 568 | 47.4 |
| 8 | 584 | 47.8 |
| 9 | 602 | 47.7 |
| 10 | 613 | 47.8 |
| 11 | 598 | 47.9 |
| 12 | 589 | 47.7 |
| 13 | 579 | 47.9 |

Example 11

Table 9 shows the light output, decay time and energy resolution measured for an LYSO with relatively high concentration of Ca (Ce 0.1%, Ca 0.15%, Y 5%).

TABLE 9

| Slab number | Light Output* [chMCA] | Decay Time [ns] |
|---|---|---|
| 1 | 359 | 35.8 |
| 2 | 405 | 36 |
| 3 | 409 | 35.9 |
| 4 | 402 | 36.3 |
| 5 | 463 | 36.8 |
| 6 | 501 | 36.9 |
| 7 | 485 | 36.7 |

Example 12

Table 10 shows the light output and decay time measured for an LYSO doped with Ce 0.2%, Ca 0.01%, Mg 0.015% and Y 1%. Variations in decay time between slab 1 through slab 10, we believe are due to differences in segregation coefficients between Mg and Ca while the Mg is depleted and melt becomes increasingly enriched in Ca.

TABLE 10

| Slab number | Light Output* [chMCA] | Decay Time [ns] |
|---|---|---|
| 1 | 369 | 43.1 |
| 2 | 434 | 43.1 |
| 3 | 520 | 45.4 |
| 4 | 547 | 45.7 |
| 5 | 564 | 46 |
| 6 | 546 | 45.8 |
| 7 | 579 | 47 |
| 8 | 574 | 47.5 |
| 9 | 570 | 47.1 |
| 10 | 556 | 45.7 |

III. Summary

Thus, LSO scintillator crystals with high light yield have been produced according to the present disclosure. Codoping of cerium and one or more of ions from Groups IIA and/or IIB can be made in predetermined ratios of concentration to achieve desired properties of the crystal and crystal growth stability.

Because many embodiments of the invention can be made without departing from the spirit and scope of the invention, the invention resides in the claims hereinafter appended.

We claim:

1. A method of growing a single-crystalline scintillator material from a melt having a composition of the formula, $Lu_{2(1-x-y)}Ce_{2x}A_{2y}SiO_5$, wherein A consists essentially of Ca, Mg, Sr, Zn or Cd or any combination thereof, the method comprising:
   selecting a fluorescence decay time between about 30 ns and about 50 ns, inclusive, to be achieved for the grown single-crystalline material;
   based on the decay time to be achieved, determining a relative value between x and y, wherein x is greater than or equal to 0.00001 and less than or equal to 0.002, y is greater than or equal to 0.00001 and less than or equal to 0.1, and y is about three times x or greater, so as to achieve stable growth of the single-crystalline scintillator material from the melt; and
   growing a single-crystalline scintillator material from the melt with the relative value between x and y.

2. The method of claim 1, wherein A consists essentially of Mg, Ca, Sr or any combination thereof.

3. A method of growing a single-crystalline scintillator material from a melt having a composition of the formula, $Lu_{2(1-x-y)}Ce_{2x}Sr_{2y}SiO_5$, the method comprising:
   selecting a fluorescence decay time between about 30 ns and about 50 ns, inclusive, to be achieved for the grown single-crystalline material;
   based on the decay time to be achieved, determining a relative value between x and y, wherein x is greater than or equal to 0.00001 and less than or equal to 0.1, y is greater than or equal to 0.00001 and less than or equal to 0.1, and y is greater than or equal to x, so as to achieve stable growth of the single-crystalline scintillator material from the melt; and
   growing a single-crystalline scintillator material from the melt with the relative value between x and y.

4. A method of growing a single-crystalline scintillator material from a melt having a composition of the formula, $Lu_{2(1-x-y)}Ce_{2x}Sr_{2y}SiO_5$, the method comprising:
   selecting a fluorescence decay time between about 30 ns and about 50 ns, inclusive, to be achieved for the grown single-crystalline material;
   based on the decay time to be achieved, determining a relative value between x and y, wherein x is greater than or equal to 0.00001 and less than or equal to 0.1, y is greater than or equal to 0.00001 and less than or equal to 0.1, and x is greater than or equal to y, so as to achieve stable growth of the single-crystalline material from the melt; and
   growing a single-crystalline scintillator material from the melt with the relative value between x and y.

5. A method of growing a single-crystalline scintillator material from a melt having a composition of the formula, $Lu_{2(1-x-y)}Ce_{2x}Ca_{2y}SiO_5$, the method comprising:
   selecting a fluorescence decay time between about 30 ns and about 50 ns, inclusive, to be achieved for the grown single-crystalline material;
   based on the decay time to be achieved, determining a relative value between x and y, wherein x is greater than or equal to 0.00001 and less than or equal to 0.1, y is greater than or equal to 0.00001 and less than or equal to 0.1, and y is greater than or equal to x, so as to achieve stable growth of the single-crystalline scintillator material from the melt; and
   growing a single-crystalline scintillator material from the melt with the relative value between x and y.

6. A method of growing a single-crystalline scintillator material from a melt having a composition of the formula, $Lu_{2(1-x-y)}Ce_{2x}Ca_{2y}SiO_5$, the method comprising:
   selecting a fluorescence decay time between about 30 ns and about 50 ns, inclusive, to be achieved for the grown single-crystalline material;
   based on the decay time to be achieved, determining a relative value between x and y, wherein x is greater than or equal to 0.00001 and less than or equal to 0.1, y is greater than or equal to 0.00001 and less than or equal to 0.1, and x is greater than or equal to y, so as to achieve stable growth of the single-crystalline scintillator material from the melt; and
   growing a single-crystalline scintillator material from the melt with the relative value between x and y.

7. A method of growing a single-crystalline scintillator material from a melt having a composition of the formula, $Lu_{2(1-x-y)}Ce_{2x}Mg_{2y}SiO_5$, the method comprising:
   selecting a fluorescence decay time between about 30 ns and about 50 ns, inclusive, to be achieved for the grown single-crystalline material;
   based on the decay time to be achieved, determining a relative value between x and y, wherein x is greater than or equal to 0.00001 and less than or equal to 0.1, y is greater than or equal to 0.00001 and less than or equal to 0.1, and y is greater than or equal to x, so as to achieve stable growth of the single-crystalline scintillator material from the melt; and
   growing a single-crystalline scintillator material from the melt with the relative value between x and y.

8. A method of growing a single-crystalline scintillator material from a melt having a composition of the formula, $Lu_{2(1-x-y)}Ce_{2x}Mg_{2y}SiO_5$, the method comprising:
- selecting a fluorescence decay time between about 30 ns and about 50 ns, inclusive, to be achieved for the grown single-crystalline material;
- based on the decay time to be achieved, determining a relative value between x and y, wherein x is greater than or equal to 0.00001 and less than or equal to 0.1, y is greater than or equal to 0.00001 and less than or equal to 0.1, and x is greater than or equal to y, so as to achieve stable growth of the single-crystalline scintillator material from the melt; and
- growing a single-crystalline scintillator material from the melt with the relative value between x and y.

9. A method of growing a single-crystalline scintillator material from a melt having a composition of the formula, $Lu_{2x}Mg_{2y'}Ca_{2y''}Sr_{2y'''}Lu_{2(1-x-y'-y''-y''')}SiO_5$, wherein Ln consists essentially of one or more lanthanides, one or more actinides or a combination thereof,
- wherein $y=y'+y''+y'''$, and
- y' is greater or equal to about 0.00001 and less or equal to about 0.1,
- y'' is greater or equal to about 0.00001 and less or equal to about 0.1, and
- y''' is greater or equal to about 0.00001 and less or equal to about 0.1, the method comprising:
- selecting a fluorescence decay time between about 30 ns and about 50 ns, inclusive, to be achieved for the grown single-crystalline material;
- based on the decay time to be achieved, determining a relative value between x and y, wherein x is greater than or equal to 0.00001 and less than or equal to 0.1, y is greater than or equal to 0.00001 and less than or equal to 0.1, and x is greater than or equal to y, so as to achieve stable growth of the single-crystalline scintillator material from the melt; and
- growing a single-crystalline scintillator material from the melt with the relative value between x and y.

10. A method of growing a single-crystalline scintillator material from a melt having a composition of the formula $Ln_{2x}A_{2u}Lu_{2(1-x-u-v-w)}Y_{2v}Gd_{2w}SiO_5$, wherein Ln consists essentially of one or more lanthanides, one or more actinides or a combination thereof, wherein
- u is greater or equal to about 0.00001 and less or equal to about 0.1,
- v is greater or equal to about 0.00001 and less or equal to about 0.9999, and
- w is greater or equal to about 0.00001 and less or equal to about 0.9999, the method comprising:
- selecting a fluorescence decay time between about 30 ns and about 50 ns, inclusive, to be achieved for the grown single-crystalline material;
- based on the decay time to be achieved, determining a relative value between x and u, wherein x is greater than or equal to 0.00001 and less than or equal to 0.1, u is greater than or equal to 0.00001 and less than or equal to 0.1, and x is greater than or equal to u, so as to achieve stable growth of the single-crystalline scintillator material from the melt; and
- growing a single-crystalline scintillator material from the melt with the relative value between x and y.

11. A single-crystalline scintillator material grown from a melt having a composition of the formula, $Ln_{2x}A_{2y}Lu_{2(1-x-y)}SiO_5$, wherein:
- Ln consists essentially of one or more lanthanides, one or more actinides or a combination thereof,
- A consists essentially of one or more Group-IIA or -IIB elements of the periodic table of elements or any combination thereof,
- x is greater than or equal to 0.00001 and less than or equal to 0.002, and
- A consists essentially of Ca, Mg, Sr, Zn or Cd or any combination thereof, y is greater than or equal to 0.00001 and less than or equal to 0.1 and is about three times x or greater.

12. The single-crystalline scintillator material of claim 11, wherein:
- Ln consists essentially of Ce, and
- A consists essentially of Mg.

13. The single-crystalline scintillator material of claim 11, wherein:
- Ln consists essentially of Ce,
- A consists essentially of Sr.

* * * * *